US010031539B2

(12) United States Patent
Kato et al.

(10) Patent No.: US 10,031,539 B2
(45) Date of Patent: Jul. 24, 2018

(54) OUTPUT CIRCUIT AND VOLTAGE GENERATING DEVICE

(71) Applicant: Azbil Corporation, Chiyoda-ku (JP)

(72) Inventors: Taichiro Kato, Chiyoda-ku (JP); Tetsuya Kajita, Chiyoda-ku (JP)

(73) Assignee: AZBIL CORPORATION, Chiyoda-ku (JP)

(*) Notice: Subject to any disclaimer, the term of this patent is extended or adjusted under 35 U.S.C. 154(b) by 0 days.

(21) Appl. No.: 15/108,384

(22) PCT Filed: Oct. 20, 2014

(86) PCT No.: PCT/JP2014/077784
§ 371 (c)(1),
(2) Date: Jun. 27, 2016

(87) PCT Pub. No.: WO2015/098255
PCT Pub. Date: Jul. 2, 2015

(65) Prior Publication Data
US 2016/0320782 A1 Nov. 3, 2016

(30) Foreign Application Priority Data
Dec. 27, 2013 (JP) ................. 2013-271363

(51) Int. Cl.
G05F 1/565 (2006.01)
G05F 1/575 (2006.01)
(Continued)

(52) U.S. Cl.
CPC ............. G05F 1/575 (2013.01); G05F 1/56 (2013.01); H03F 1/34 (2013.01); H03F 3/345 (2013.01)

(58) Field of Classification Search
CPC . G05F 1/461; G05F 1/56; G05F 1/565; G05F 1/613; G05F 1/575
(Continued)

(56) References Cited

U.S. PATENT DOCUMENTS 5,677,646 A    10/1997  Entrikin
5,864,227 A *  1/1999  Borden ................. G05F 1/618
                                                       323/280
(Continued)

FOREIGN PATENT DOCUMENTS

JP     2000-39923 A    8/2000
JP     2004-30220 A    1/2004
WO     WO 97/24799 A1  7/1997

OTHER PUBLICATIONS

Extended European Search Report dated Aug. 4, 2017 in Patent Application No. 14874759.5.
(Continued)

Primary Examiner — Alex Torres-Rivera
(74) Attorney, Agent, or Firm — Oblon, McClelland, Maier & Neustadt, L.L.P.

(57) ABSTRACT

An output circuit (10) according to the present invention includes a first output terminal (VO) and a second output terminal (SGND); an output transistor (MP1) connected between a first fixed-potential node (VCC) and the first output terminal; an output load (15) connected between the first output terminal and the second output terminal; a control circuit (13) that controls the output transistor so that a monitor voltage (VS) based on a voltage between the first output terminal and the second output terminal matches an input voltage (VI); a constant voltage source (16) whose one end is connected to the second terminal and whose other end is connected to a second fixed-potential node (GND); and a circuit (R4) that forms a current path between the first output terminal and the second fixed-potential node. Accordingly, in the output circuit, stability of a negative feedback loop can be enhanced, and linearity of an output voltage with respect to an input voltage can be enhanced.

9 Claims, 5 Drawing Sheets

(51) Int. Cl.
*H03F 1/34* (2006.01)
*H03F 3/345* (2006.01)
*G05F 1/56* (2006.01)

(58) Field of Classification Search
USPC ....... 323/226, 273, 274, 275, 279, 280, 281, 323/303
See application file for complete search history.

(56) References Cited

U.S. PATENT DOCUMENTS

| | | | |
|---|---|---|---|
| 6,104,179 A | 8/2000 | Yukawa | |
| 7,221,213 B2* | 5/2007 | Lee | G05F 1/571 323/280 |
| 7,855,537 B2* | 12/2010 | Aizawa | G05F 1/573 323/277 |
| 8,674,672 B1* | 3/2014 | Johal | G05F 1/575 323/275 |
| 2005/0280464 A1* | 12/2005 | Kimura | G05F 1/565 327/538 |
| 2013/0134952 A1* | 5/2013 | Imura | G05F 1/575 323/280 |
| 2013/0147448 A1 | 6/2013 | Kadanka | |

OTHER PUBLICATIONS

A. Wyszynnski, "Low-voltage CMOS and BiCMOS triode transconductors and integrators with gain-enhanced linearity and output impedance", Electronics Letters, vol. 30, No. 3, XP6000177A, 1994, pp. 211-213.
International Search Report dated Jan. 20, 2015, in PCT/JP2014/077784 filed Oct. 20, 2014.

* cited by examiner

PRIOR ART

US 10,031,539 B2

OUTPUT CIRCUIT AND VOLTAGE GENERATING DEVICE

TECHNICAL FIELD

The present invention relates to an output circuit and a voltage generating device, and specifically to an output circuit that generates a linear output voltage with respect to an input voltage.

BACKGROUND ART

In recent years, as control systems that control a target such as an operation valve on the basis of a detection signal received from various types of sensors in a flowmeter, air-conditioning equipment, or the like, there have been more control systems that calculate, by using a microcomputer, an amount of control or the like for a target to be controlled, eventually convert a control signal corresponding to the amount of control or the like calculated by the microcomputer into an analog signal, and output the analog signal.

Such a control system includes, for example, a voltage generating device that performs pulse width modulation (PWM) or the like on a digital signal based on a result of computation performed by the microcomputer and that converts the modulated digital signal into an analog signal by using a D/A converter so as to generate a control signal. Such a voltage generating device is required to output a linear voltage or linear current with respect to an input signal in a predetermined range. A voltage generating device in an industrial control system is required to, for example, output a voltage of 0 to 10 V or a current of 4 to 20 mA.

The output circuit disclosed in PTL 1 is known as an example of an output circuit in a final stage of a voltage generating device according to the related art. The output circuit 60 described in PTL 1 includes, as illustrated in FIG. 8, an operational amplifier U6 and a three-terminal regulator 65. The operational amplifier U6 controls a voltage at a ground terminal of the three-terminal regulator 65 on the basis of an input voltage VI supplied from a D/A converter 62 in a computer 61, thereby generating a voltage Vout equal to the input voltage VI. The output circuit 60 further includes a control device 63 that monitors the input voltage VI and a switch 64 that is formed of a contactless switch connected between an output terminal of the three-terminal regulator 65 and a load Z. If the control device 63 detects that the input voltage VI is 0 V, the switch 64 is opened so as to enable the voltage Vout to be 0 V.

Also, the output circuit disclosed in PTL 2 is known as another example of an output circuit in a voltage generating device according to the related art. The output circuit 70 described in PTL 2 includes, as illustrated in FIG. 9, an operational amplifier U8, an amplification circuit formed of a transistor Q1 and a resistor R5, and an amplification circuit formed of a transistor MP7 and a resistor R6. The operational amplifier U8 controls the transistor Q1 on the basis of an input voltage VI and thereby a voltage VOX equal to the input voltage VI is output. Although not disclosed in PTL 2, a modulation circuit 71 and a D/A converter 72 are illustrated as a circuit that generates the input voltage VI for convenience of description.

The output circuit 70 described in PTL 2 is able to output a voltage VOX of 0 V in response to a voltage VI of 0 V input to the output circuit 70.

CITATION LIST

Patent Literature

PTL 1: Japanese Unexamined Patent Application Publication No. 5-341860
PTL 2: Japanese Unexamined Patent Application Publication No. 5-114844

SUMMARY OF INVENTION

Technical Problem

However, the output circuit described in PTL 1 is able to output a voltage of 0 V but is not able to continuously (linearly) output a voltage of around 0 V. Thus, the linearity of the voltage Vout with respect to the input voltage VI is not maintained over an entire range of the output voltage.

In the output circuit described in PTL 2, the input voltage VI needs to be 0 V in order to output a voltage VOX of 0 V. However, if the circuit in the output stage of the D/A converter 72 is formed of an OP amplifier U7 as illustrated in FIG. 9, it is not easy to generate an input voltage VI of 0 V because it is generally difficult for an OP amplifier to output 0 V.

Even if an input voltage VI of 0 V can be generated, the transistor MP7 is in an off state (inactive state) and a negative feedback loop of the output circuit 70 is unstable when the input voltage VI is 0 V in the output circuit described in PTL 2, and thus it is not possible to accurately generate an output voltage.

To solve the above-described problems, the inventors considered a new configuration of an output circuit prior to the present application.

FIG. 10 is a diagram illustrating an output circuit considered by the inventors prior to the present application. An output circuit 80 illustrated in FIG. 10 includes diodes DX1 and DX2, which are provided between a ground node GND and a virtual ground terminal VX, and thereby generates an output voltage VOLX with reference to the virtual ground terminal VX at which the voltage is higher than a ground voltage.

Theoretically, the output circuit 80 is able to generate a voltage VOLX of 0 V. Even in the case of making the voltage VOLX 0 V in the output circuit 80, the D/A converter 72 may generate an input voltage VI that is higher than the voltage at the virtual terminal VX SGND. In other words, the OP amplifier U7 in the D/A converter 72 does not need to output a voltage of 0 V.

However, in the output circuit 80 illustrated in FIG. 10, the transistor MP7 is in an off state when the output voltage VOLX is 0 V and is thus the negative feedback loop of the output circuit 80 is unstable as in the above-described output circuit 70 illustrated in FIG. 9. Thus, it is difficult for the output circuit 80 to accurately generate an output voltage.

The present invention has been made to solve the above-described problems, and an object of the present invention is to enhance the stability of a negative feedback loop and enhance the linearity of an output voltage with respect to an input voltage in an output circuit.

Solution to Problem

An output circuit according to the present invention includes a first output terminal and a second output terminal; an output transistor connected between a first fixed-potential node to which a direct current voltage is supplied and the first output terminal; an output load connected between the first output terminal and the second output terminal; a control circuit that controls the output transistor so that a monitor voltage based on a voltage between the first output terminal and the second output terminal matches an input voltage supplied from an outside; a constant voltage source that generates a constant voltage, one end of the constant voltage source being connected to the second terminal, the other end of the constant voltage source being connected to a second fixed-potential node to which a direct current voltage different from the direct current voltage supplied to the first fixed-potential node is supplied; and a circuit that forms a current path between the first output terminal and the second fixed-potential node.

Advantageous Effects of Invention

On the basis of the description given above, according to the present invention, it becomes able to enhance the stability of a negative feedback loop and enhance the linearity of an output voltage with respect to an input voltage in an output circuit.

DESCRIPTION OF EMBODIMENTS

Figure 1:
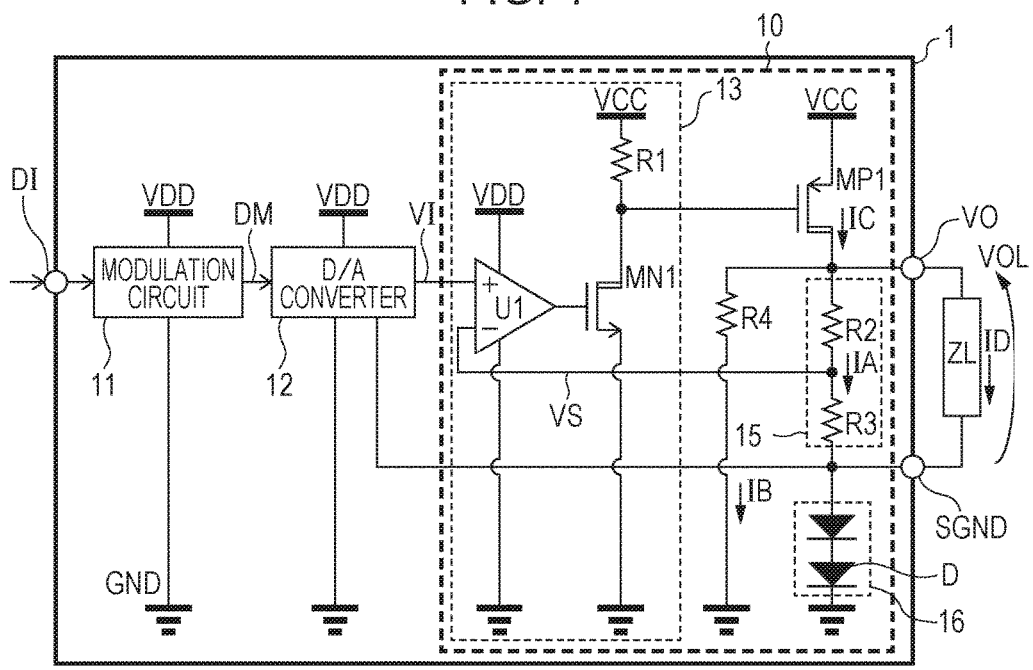
FIG. 1 is a diagram illustrating a voltage generating device including an output circuit according to an embodiment of the present invention.

Hereinafter, embodiments of the present invention will be described with reference to the drawings.
First Embodiment FIG. 1 is a diagram illustrating a voltage generating device including an output circuit according to an embodiment of the present invention. The voltage generating device 1 illustrated in FIG. 1 generates a voltage corresponding to a digital signal supplied to a digital input terminal DI and outputs the generated voltage from two output terminals VO and SGND. An external load ZL is connected between the output terminal VO and the output terminal SGND. With a current being flown from the output terminal VO to the output terminal SGND via the load ZL, the load ZL is driven.

Specifically, the voltage generating device 1 includes a modulation circuit 11, a D/A converter 12, an output circuit 10, and a plurality of external terminals. FIG. 1 illustrates, as representatives of the plurality of external terminals, the above-described digital input terminal DI, output terminal VO, and output terminal SGND.

To the voltage generating device 1, a ground voltage GND and two different power supply voltages VCC and VDD are supplied through an external terminal that is not illustrated. The power supply voltage VCC is, for example, a voltage ranging from 10 to 15 V. The power supply voltage VDD is, for example, 5 V. Although not particularly limited, the modulation circuit 11, the D/A converter 12, and a differential amplification circuit U1 are operated by being supplied with power from the power supply voltage VDD. The circuit elements of the output circuit 10 except the differential amplification circuit U1 are operated by being supplied with power from the power supply voltage VCC. The modulation circuit 11, the D/A converter 12, and the differential amplification circuit U1 that will be described below are configured as, for example, one-chip semiconductor device formed on one semiconductor substrate through a known CMOS manufacturing process.

In the following description, the reference symbols VCC, VDD, and GND represent not only voltages but also the nodes to which the voltages are supplied.

The modulation circuit 11 modulates a digital signal supplied to the digital input terminal DI from the outside and outputs the digital signal. Examples of a modulation scheme used by the modulation circuit 11 include pulse width modulation (PWM), pulse frequency modulation (PFM), and delta/sigma modulation.

The D/A converter 12 converts the digital signal DM modulated by the modulation circuit 11 into an analog signal (for example, a voltage signal).

Figure 2:
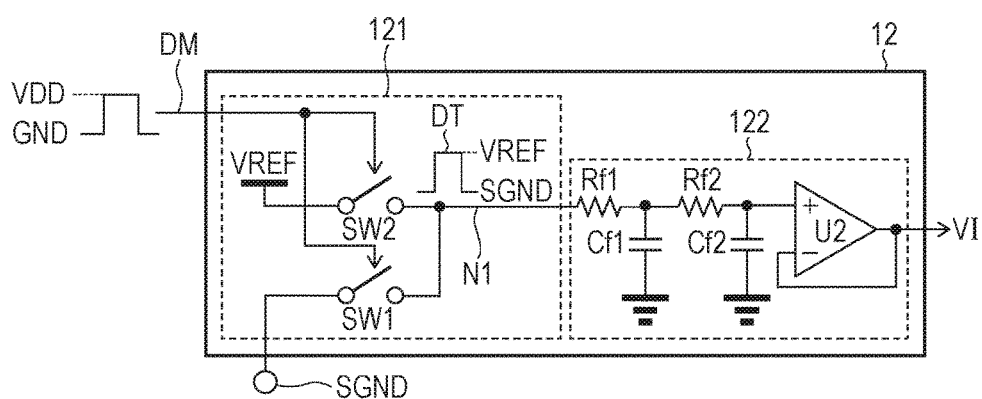
FIG. 2 is a diagram illustrating the internal configuration of a D/A converter in the voltage generating device according to the embodiment of the present invention.

FIG. 2 is a diagram illustrating the internal configuration of the D/A converter 12. As illustrated in FIG. 2, the D/A converter 12 is formed of, for example, a conversion circuit 121 and a smoothing circuit 122.

The conversion circuit 121 converts the digital signal DM modulated by the modulation circuit 11 into a digital signal with an amplitude based on the voltage at the output terminal SGND. Specifically, the conversion circuit 121 includes, for example, switch circuits SW1 and SW2. One end of the switch circuit SW1 is connected to a node to which the output terminal SGND is connected. The other end of the switch circuit SW1 is connected to a node N1. One end of the switch circuit SW2 is connected to a node to which a reference voltage VREF is supplied, and the other end is connected to the node N1. Although not particularly limited, the switch circuits SW1 and SW2 are formed of, for example, analog switches or the like using MOS transistors or the like. The reference voltage VREF is a voltage generated by a constant voltage generation circuit (not illustrated) provided in the voltage generating device 1. For example, the reference voltage VREF is a voltage that is higher than the voltage at the output terminal SGND (for example, 1 V) and is lower than the power supply voltage VDD (5 V).

Switching between on and off of the switch circuit SW1 and the switch circuit SW2 is controlled in accordance with, for example, the logical level of the modulated digital signal DM. Specifically, the switch circuit SW1 is off and the switch circuit SW2 is on when the digital signal DM is in a high level, whereas the switch circuit SW1 is on and the switch circuit SW2 is off when the digital signal DM is in a low level. Accordingly, the digital signal DM with an amplitude between VDD and GND is converted into a digital signal DT with an amplitude between VREF and SGND and is output to the node N1.

The smoothing circuit 122 smooths the digital signal DT that is obtained through conversion performed by the conversion circuit 121. The smoothing circuit 122 includes, for example, low-pass filters formed of resistors Rf1 and Rf2 and capacitors Cf1 and Cf2, and a differential amplification circuit U2. The differential amplification circuit U2 forms a voltage follower circuit. The differential amplification circuit U2 is, for example, an OP amplifier. Accordingly, the differential amplification circuit U2 outputs a voltage equal to a voltage smoothed by the foregoing low-pass filter circuit. Accordingly, an analog signal (voltage) corresponding to the pulse width of the digital signal DT is generated and supplied to the output circuit 10.

In this way, the digital signal supplied to the digital input terminal DI is converted into an analog signal that is based on the potential at the output terminal SGND by the modulation circuit 11 and the D/A converter 12.

The output circuit 10 generates a voltage VOL that is proportional to the analog signal obtained through conversion performed by the D/A converter 12 and outputs the voltage VOL from between the output terminals VO and SGND. Hereinafter, the analog signal supplied from the D/A converter 12 to the output circuit 10 is referred to as an input voltage VI. The referent symbol VI represents not only the input voltage but also the input terminal of the differential amplification circuit U1 to which the voltage is supplied.

Specifically, the output circuit 10 is formed of a negative feedback amplification circuit 13, an output transistor MP1, an output load 15, a constant voltage source 16, and a resistor R4. Although not particularly limited, the transistors MP1 and MN1, the resistors R1 to R4, and the constant voltage source 16 that form the output circuit 10 are discrete components, for example.

The output transistor MP1 is connected between the power supply node VCC and the output terminal VO. The output transistor MP1 is, for example, a power transistor having a current output ability for driving the load ZL, and is, for example, a P-channel MOS transistor. A source electrode of the output transistor MP1 is connected to the power supply node VCC and a drain electrode of the output transistor MP1 is connected to the output terminal VO.

In this embodiment, the source electrode of the output transistor MP1 corresponds to a first main electrode of an output transistor according to the present invention, the drain electrode of the output transistor MP1 corresponds to a second main electrode of the output transistor according to the present invention, and a gate electrode of the output transistor MP1 corresponds to a control electrode of the output transistor according to the present invention.

The output load 15 is connected between the output terminal VO and the output terminal SGND. The output load 15 is formed of, for example, the resistors R2 and R3 connected in series between the output terminal VO and the output terminal SGND. A voltage generated by dividing a voltage by the resistors R2 and R3 is input as a monitor voltage VS to the negative feedback amplification circuit 13. Accordingly, the monitor voltage VS becomes a voltage proportional to the output voltage VOL.

The negative feedback amplification circuit 13 is a control circuit that controls the output transistor MP1 so that the monitor voltage VS matches the input voltage VI. The negative feedback amplification circuit 13 includes, for example, the differential amplification circuit U1 and a source grounded circuit formed of the transistor MN1 and the resistor R1.

The input voltage VI is supplied to a noninverting input terminal (+) of the differential amplification circuit U1, and the monitor voltage VS is supplied to an inverting input terminal (−) of the differential amplification circuit U1. The differential amplification circuit U1 is, for example, an OP amplifier.

The transistor MN1 is, for example, an N-channel MOS transistor. A source electrode of the transistor MN1 is connected to the ground node GND, a drain electrode of the transistor MN1 is connected to the resistor R1, and a gate electrode of the transistor MN1 is connected to the output terminal of the differential amplification circuit U1. The resistor R1 is a load element connected between the drain electrode of the transistor MN1 and the power supply node VCC. A voltage at a connection node to which the resistor R1 and the drain electrode of the transistor MN1 are connected is supplied to the gate electrode of the transistor MP1.

In this embodiment, the source electrode of the transistor MN1 corresponds to a first main electrode of an amplification transistor according to the present invention, the drain electrode of the transistor MN1 corresponds to a second main electrode of the amplification transistor according to the present invention, and the gate electrode of the transistor MN1 corresponds to a control electrode of the amplification transistor according to the present invention.

The constant voltage source 16 generates a constant voltage at both ends thereof. One end of the constant voltage source 16 is connected to the output terminal SGND, and the other end of the constant voltage source 16 is connected to the ground node GND. Although not particularly limited, the voltage generated at both ends of the constant voltage source 16 is, for example, 1 V. The constant voltage source 16 is formed of, for example, one diode D or a plurality of diodes D connected in series. An anode of the diode D is connected to the output terminal SGND side, and a cathode of the diode D is connected to the ground node GND side. FIG. 1 illustrates a case where the constant voltage source 16 is formed of two diodes D connected in series. The number of diodes connected in series and the types of diodes can be changed in accordance with the voltage that is to be generated at both ends of the constant voltage source 16. As the diodes D, PN diodes, Schottky barrier diodes, Zener diodes, or the like may be used, for example. The constant voltage source 16 may be formed by connecting in series the same type of diodes or different types of diodes.

The resistor R4 functions as a circuit that forms a current path between the output terminal VO and the ground node GND. Accordingly, for example, in a case where the output voltage VOL is 0 V, a sufficient current IB can be flown from the output terminal VO to the ground node GND via the resistor R4 even if a current IA of the resistors R2 and R3 and a current ID of the load ZL are zero, and thus the output transistor MP1 is kept in an active state. That is, the output transistor MP1 is not turned off. Although not particularly limited, the sufficient current IB is desirably a current that allows the transistor MP1 to operate in a saturation region even if the current IA of the resistors R2 and R3 and the current ID of the load ZL are zero.

With the above-described configuration of the output circuit 10, the voltage VOL proportional to the input voltage VI is output from between the output terminals VO and SGND and is supplied to the load ZL.

Figure 3:
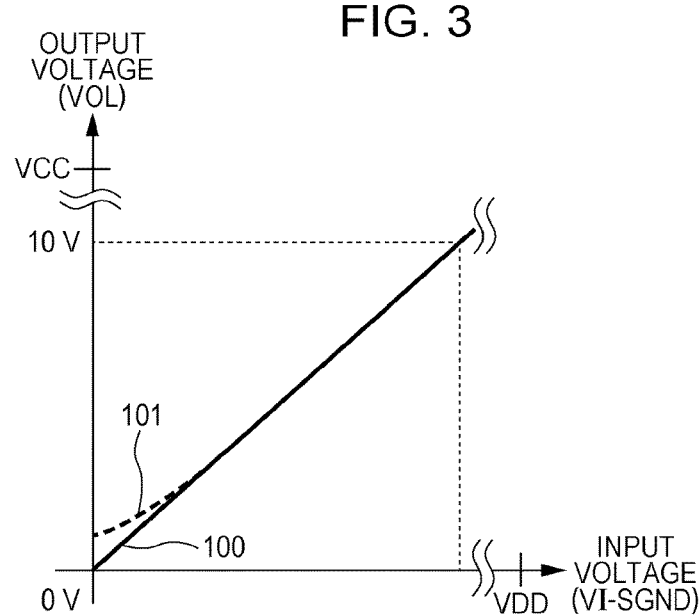
FIG. 3 is a diagram illustrating input/output characteristics of the output circuit according to the embodiment of the present invention.
Figure 9:
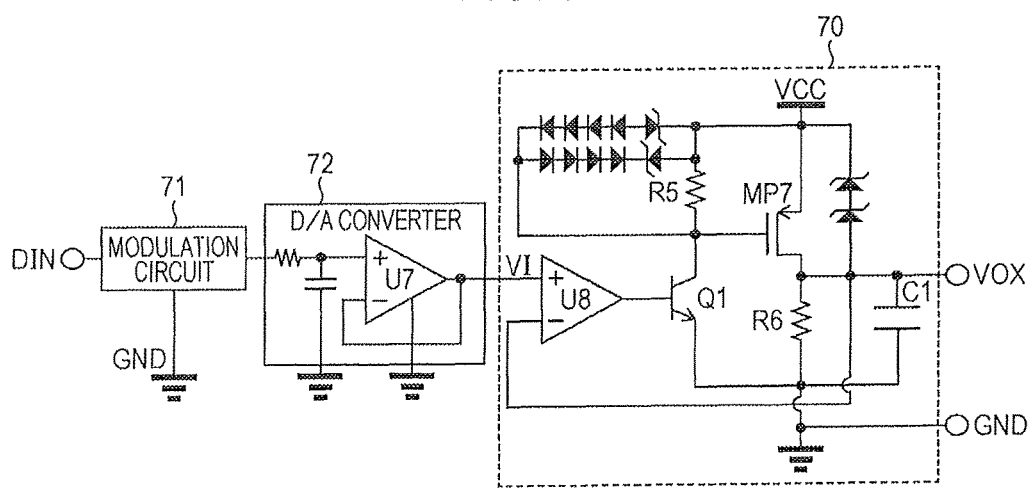
FIG. 9 is a diagram illustrating another output circuit according to the related art.
Figure 10:
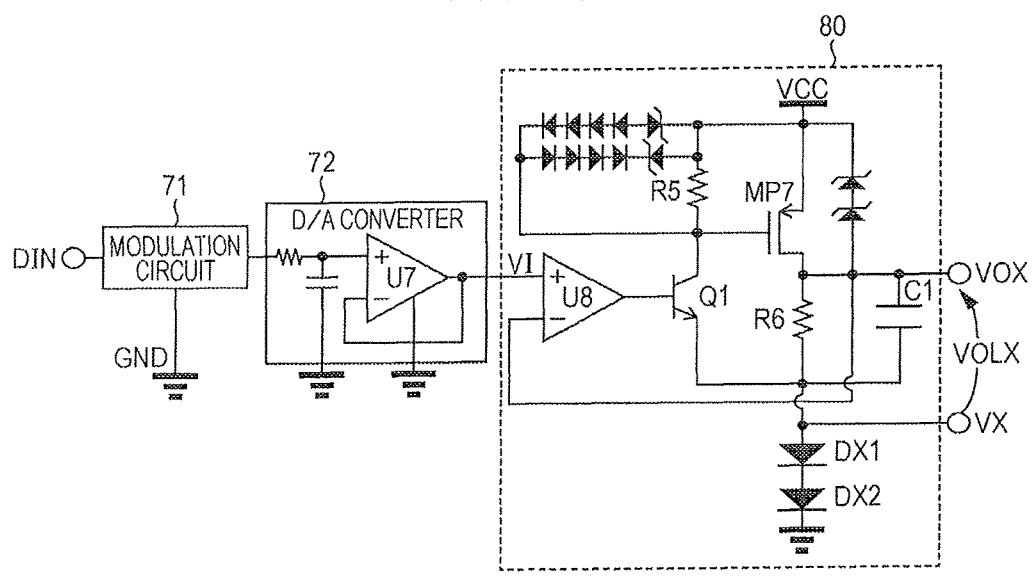
FIG. 10 is a diagram illustrating an output circuit considered by the inventors of the present application prior to the present application.

FIG. 3 is a diagram illustrating input/output characteristics of the output circuit 10. In FIG. 3, the horizontal axis represents the voltage between the output terminal SGND and the input terminal VI of the output circuit 10 and the vertical axis represents the output voltage VOL of the output circuit 10. Reference numeral 100 denotes the input/output characteristics of the output circuit 10 according to this embodiment and reference numeral 101 denotes the input/output characteristics of the above-described output circuit according to the related art illustrated in FIG. 9.

Figure 8:
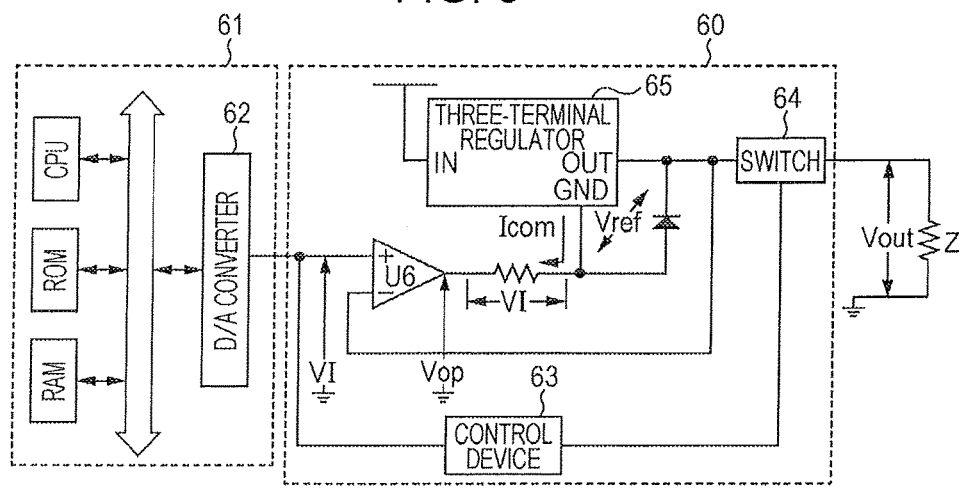
FIG. 8 is a diagram illustrating an output circuit according to the related art.

As illustrated in FIG. 3, in the output circuit according to the related art (for example, the output circuit illustrated in FIG. 8 or 9), an output transistor is not sufficiently turned on and a negative feedback loop is unstable at around 0 V. and thus it is difficult to accurately output a voltage of around 0 V. Thus, in the output circuit according to the related art, the linearity with respect to the input voltage is deteriorated. In contrast, in the output circuit 10 according to this embodiment, the output voltage VOL is generated with reference to the output terminal SGND at which the potential is higher than at the ground node GND, and the output transistor MP1 can be sufficiently turned on even in the case of outputting a voltage of around 0 V, and thus the negative feedback loop of the output circuit 10 can be stabilized regardless of the output voltage VOL. Accordingly, the linearity of the output voltage VOL with respect to the input voltage can be enhanced over a wide range.

In the output circuit 10 according to this embodiment, the output voltage VOL is generated with reference to the output terminal SGND at which the potential is higher than at the ground node GND and the output voltage VOL is supplied to the load ZL. Thus, the output voltage VOL of 0 V can be supplied to the load ZL without making the voltage at the output terminal VO 0 V.

Furthermore, in the output circuit 10 according to this embodiment, a current path between the output terminal VO and the ground node GND is formed of the resistor R4. Thus, even in the case of generating the output voltage VOL of around 0 V, a sufficient current can be flown through the output transistor MP1 and the stability of the negative feedback loop in the output circuit 10 can be enhanced.

That is, in the output circuit 10 according to this embodiment, the stability of the negative feedback loop in the output circuit 10 can be enhanced and the linearity of the output voltage VOL with respect to the input voltage V1 can be enhanced.

Furthermore, in the output circuit 10 according to this embodiment, the output transistor MP1 is driven via the source grounded circuit formed of the transistor MN1 and the resistor R1, and a voltage generated by dividing a voltage by the resistors R2 and R3 is input as a monitor voltage of the output voltage VOL to the differential amplification circuit U1. Thus, the power supply voltage VDD of the differential amplification circuit U1 can be set to be lower than the power supply voltage VCC, compared to the case of directly driving the output transistor MP1 by the differential amplification circuit U1. Accordingly, the power consumption of the voltage generating device 1 can be reduced. Furthermore, as described above, in a case where the modulation circuit 11, the D/A converter 12, and the differential amplification circuit U1 are configured as a semiconductor device formed on one semiconductor substrate, the semiconductor device can be manufactured through a manufacturing process for low withstanding voltage (for example, a known CMOS process) and thus the manufacturing cost of the voltage generating device 1 can be reduced.

Furthermore, in the voltage generating device 1 according to this embodiment, the D/A converter 12 converts a modulated digital signal DM into a digital signal DM with an amplitude based on the potential at the output terminal SGND and then converts it into an analog signal (input voltage VI). Thus, even in the case of generating an output voltage VOL of 0 V, the input voltage VI corresponding to the output voltage VOL can be higher than 0 V. That is, unlike in the D/A converter according to the related art illustrated in FIG. 9, it is not necessary to generate an input voltage VI of 0 V in order to make the output voltage 0 V. Thus, in the voltage generating device 1 according to this embodiment, even if the differential amplification circuit (OP amplifier) U2 in the output stage of the D/A converter 12 is not able to accurately output 0 V, an input voltage VI corresponding to the range of the output voltage that the voltage generating device 1 is required to output can be easily generated.

Also, in the voltage generating device 1 according to this embodiment, the D/A converter 12 generates the input voltage VI with reference to the potential at the output terminal SGND, and thus temperature dependence in the same direction as that of the voltage at the output terminal SGND can be given to the input voltage VI. Accordingly, for example, even if the voltage at the output terminal SGND changes in accordance with temperature due to the temperature dependence of the forward voltage of the diodes D forming the constant voltage source 16, the voltage of the input voltage VI is changed in the same direction. As a result, the output voltage VOL is insusceptible to temperature.

In the voltage generating device according to this embodiment, analog output with enhanced linearity can be realized with respect to digital input.

Second Embodiment

Figure 4:
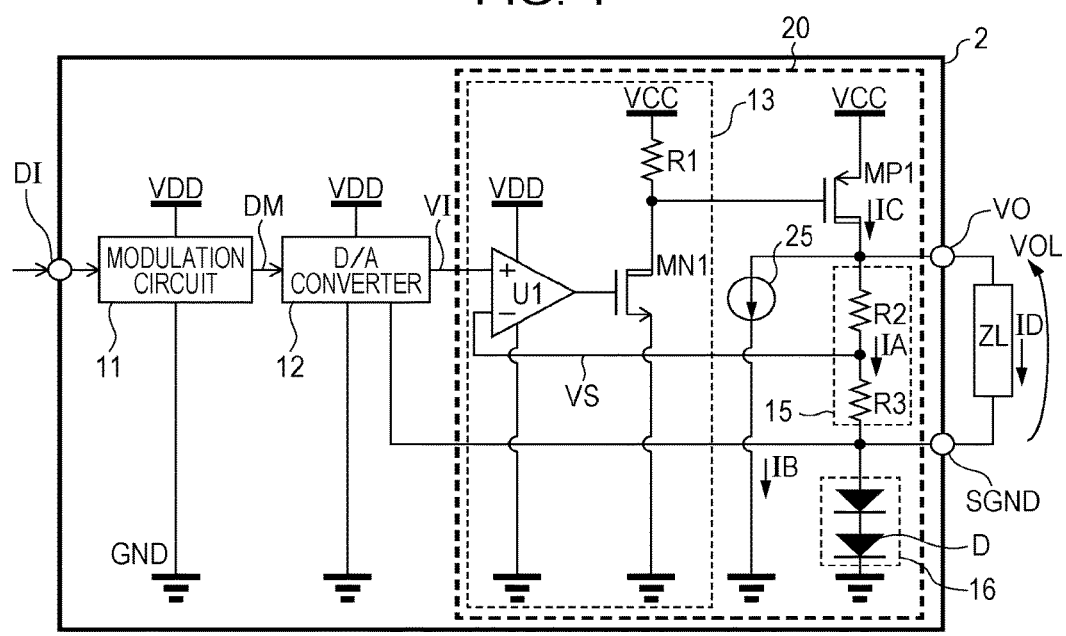
FIG. 4 is a diagram illustrating a voltage generating device including an output circuit according to a second embodiment.

FIG. 4 is a diagram illustrating a voltage generating device including an output circuit according to a second embodiment.

The voltage generating device 2 illustrated in FIG. 4 is different from the voltage generating device 1 according to the first embodiment in that it includes a constant current source circuit 25 instead of the resistor R4. Except for that, the configuration thereof is the same as that of the voltage generating device 1 according to the first embodiment. In the following description, the same elements as those of the voltage generating device 1 according to the first embodiment are denoted by the same reference numerals, and the detailed description thereof is omitted.

Specifically, the output circuit 20 includes the constant current source circuit 25, which is provided between the output terminal VO and the ground node GND. The constant current source circuit 25 generates a constant current IB in the direction of flowing from the output terminal VO side to the ground node GND side. Although not particularly limited, the constant current source circuit 25 is, for example, a current mirror circuit or the like that copies and outputs a reference current generated on the basis of a bandgap voltage or the like that is less likely to be insusceptible to power supply voltage and temperature.

Accordingly, like the output circuit 10 according to the first embodiment, a sufficient current can be flown through the output transistor MP1 even in the case of generating an output voltage VOL of around 0 V.

In the output circuit 20 according to the second embodiment, as in the output circuit 10 according to the first embodiment, the stability of the negative feedback loop in the output circuit 20 can be enhanced and the linearity of an output voltage with respect to an input voltage can be enhanced.

Third Embodiment

Figure 5:
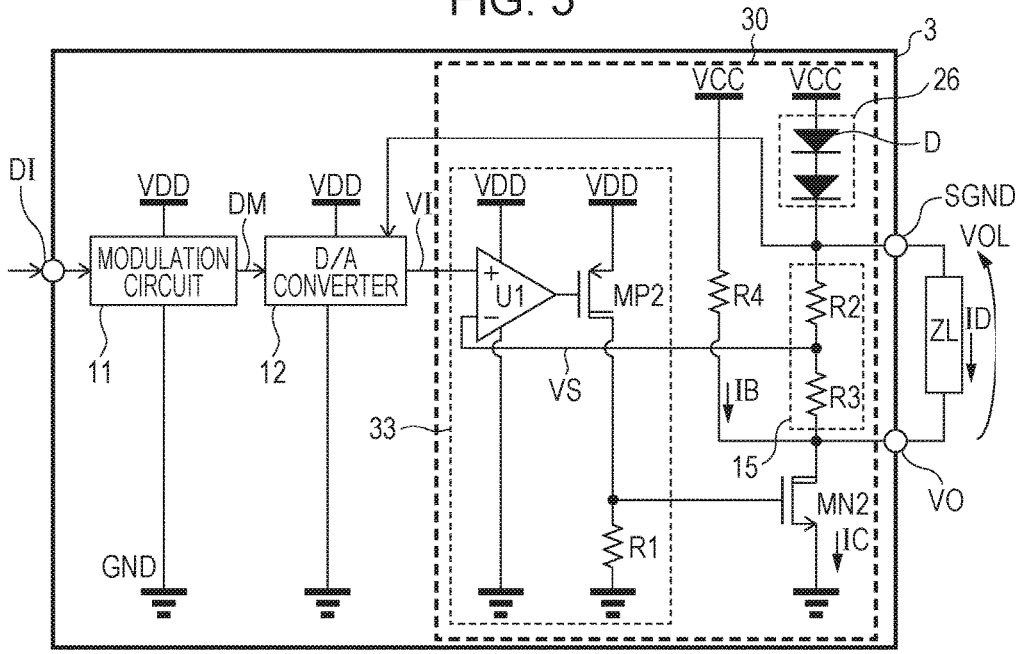
FIG. 5 is a diagram illustrating a voltage generating device including an output circuit according to a third embodiment.

FIG. 5 is a diagram illustrating a voltage generating device including an output circuit according to a third embodiment.

The voltage generating device 3 illustrated in FIG. 5 is different from the voltage generating device 1 according to the first embodiment in that the output circuit 30 is configured to determine the potential at the output terminal SGND with reference to the power supply voltage VCC. Except for the output circuit 30, the configuration thereof is the same as that of the voltage generating device 1 according to the first embodiment. In the following description, the same elements as those of the voltage generating device 1 according to the first embodiment are denoted by the same reference numerals, and the detailed description thereof is omitted.

Specifically, the output circuit 30 is formed of a negative feedback amplification circuit 33, an output transistor MN2, the output load 15, a constant voltage source 26, and the resistor R4.

The output transistor MN2 is connected between the output terminal VO and the ground node GND. The output transistor MN2 is, for example, a power transistor having a current output ability for driving the load ZL, and is, for example, an N-channel MOS transistor. A source electrode of the output transistor MN2 is connected to the ground node GND, and a drain electrode of the output transistor MN2 is connected to the output terminal VO.

In this embodiment, the source electrode of the output transistor MN2 corresponds to the first main electrode of the output transistor according to the present invention, the drain electrode of the output transistor MN2 corresponds to the second main electrode of the output transistor according to the present invention, and a gate electrode of the output transistor MN2 corresponds to the control electrode of the output transistor according to the present invention.

The negative feedback amplification circuit 33 controls the output transistor MN2 so that the monitor voltage VS matches the input voltage VI. The negative feedback amplification circuit 33 includes, for example, the differential amplification circuit U1 and a source grounded circuit formed of a transistor MP2 and the resistor R1.

The input voltage VI is supplied to the noninverting input terminal (+) of the differential amplification circuit U1, and the monitor voltage VS is supplied to the inverting input terminal (−) of the differential amplification circuit U1. The transistor MP2 is, for example, a P-channel MOS transistor. A source electrode of the transistor MP2 is connected to the power supply node VDD, a drain electrode of the transistor MP2 is connected to the resistor R1, and a gate electrode of the transistor MP2 is connected to the output terminal of the differential amplification circuit U1. The resistor R1 is a load element connected between the drain electrode of the transistor MP2 and the around node GND. The voltage at a connection node to which the resistor R1 and the drain electrode of the transistor MP2 are connected is supplied to the gate electrode of the transistor MN2.

In this embodiment, the source electrode of the transistor MP2 corresponds to the first main electrode of the amplification transistor according to the present invention, the drain electrode of the transistor MP2 corresponds to the second main electrode of the amplification transistor according to the present invention, and the gate electrode of the transistor MP2 corresponds to the control electrode of the amplification transistor according to the present invention.

The constant voltage source 26 generates a constant voltage at both ends thereof. One end of the constant voltage source 26 is connected to the output terminal SGND, and the other end of the constant voltage source 26 is connected to the power supply node VCC. Although not particularly limited, the voltage generated at both ends of the constant voltage source 26 is, for example, 1 V. The constant voltage source 26 includes, for example, one diode D or a plurality of diodes D connected in series, like the constant voltage source 16 according to the first embodiment.

The resistor R4 forms a current path between the output terminal VO and the power supply node VCC. Accordingly, a current IC that flows into the transistor MN2 is the sum of a current ID flowing through the external load ZL, a current IA flowing through the resistors R2 and R3, and a current IB flowing through the resistor R4. Thus, even in the case of making the output voltage VOL 0 V, the current IB flows from the power supply node VCC to the output terminal VO via the resistor R4 and the output transistor MN2 is kept in an active state. That is, the output transistor MN2 is not turned off.

With the above-described configuration of the output circuit 30, the voltage VOL proportional to the input voltage VI is output from between the output terminal SGND and the output terminal VO and is supplied to the load ZL.

In the output circuit 30 according to the third embodiment, as in the output circuit 10 according to the first embodiment, the stability of the negative feedback loop in the output circuit 30 can be enhanced, and the linearity of an output voltage with respect to an input voltage can be enhanced.

Fourth Embodiment

Figure 6:
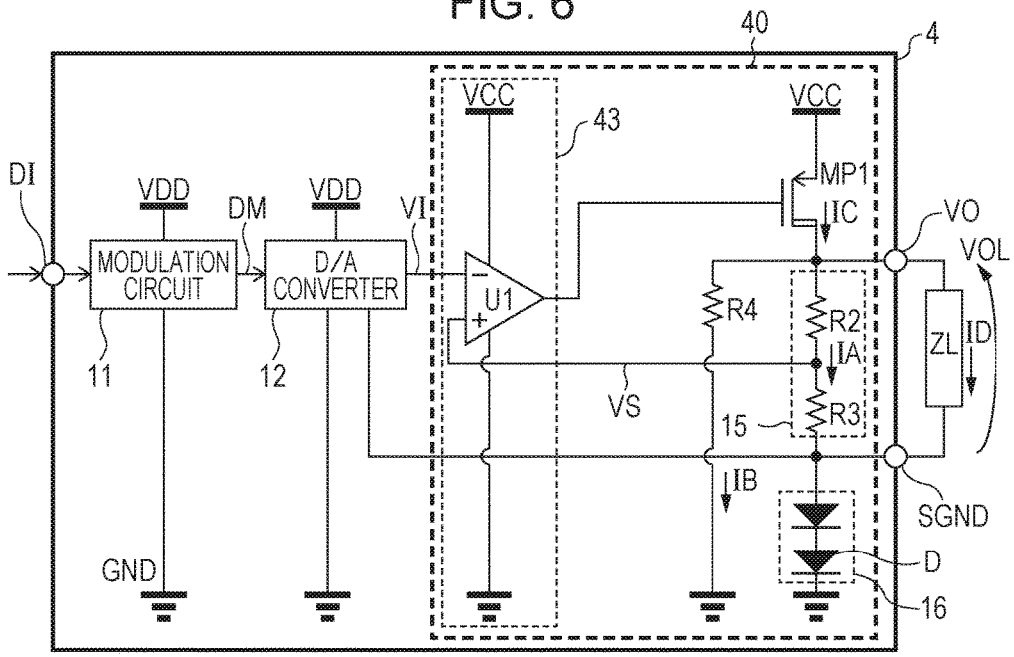
FIG. 6 is a diagram illustrating a voltage generating device including an output circuit according to a fourth embodiment.

FIG. 6 is a diagram illustrating a voltage generating device including an output circuit according to a fourth embodiment.

The voltage generating device 4 illustrated in FIG. 6 is different from the voltage generating device 1 that includes three amplification stages in that the output circuit 40 includes two amplification stages. Except for the output circuit 40, the configuration thereof is the same as that of the voltage generating device 1. In the following description, the same elements as those of the voltage generating device 1 according to the first embodiment are denoted by the same reference numerals, and the detailed description thereof is omitted.

Specifically, the output circuit 40 is formed of a negative feedback amplification circuit 43, the output transistor MP1, the output load 15, the constant voltage source 16, and the resistor R4.

The negative feedback amplification circuit 43 controls the output transistor MP1 so that the monitor voltage VS matches the input voltage VI. The negative feedback amplification circuit 43 includes, for example, the differential amplification circuit U1 that is operated by being supplied with power from the power supply node VCC.

The input voltage VI is supplied to the inverting input terminal (−) of the differential amplification circuit U1, and the monitor voltage VS is supplied to the noninverting input terminal (+) of the differential amplification circuit U1. The output voltage of the differential amplification circuit U1 is supplied to the gate electrode of the transistor MP1.

Accordingly, as in the output circuit 10 according to the first embodiment, the voltage VOL proportional to the input voltage VI is output from between the output terminal SGND and the output terminal VO, and the voltage VOL is supplied to the load ZL.

In the output circuit 40 according to the fourth embodiment, as in the output circuit 10 according to the first embodiment, the stability of the negative feedback loop in the output circuit 40 can be enhanced, and the linearity of an output voltage with respect to an input voltage can be enhanced. Furthermore, since the output circuit 40 includes two amplification stages (the differential amplification circuit U1 and the source grounded amplification circuit formed of the output transistor MP1 and the output load 15), the circuit scale can be reduced. Also, further enhancement of the stability of the output circuit 40 can be expected compared to the case where there are three amplification stages.

Fifth Embodiment

Figure 7:
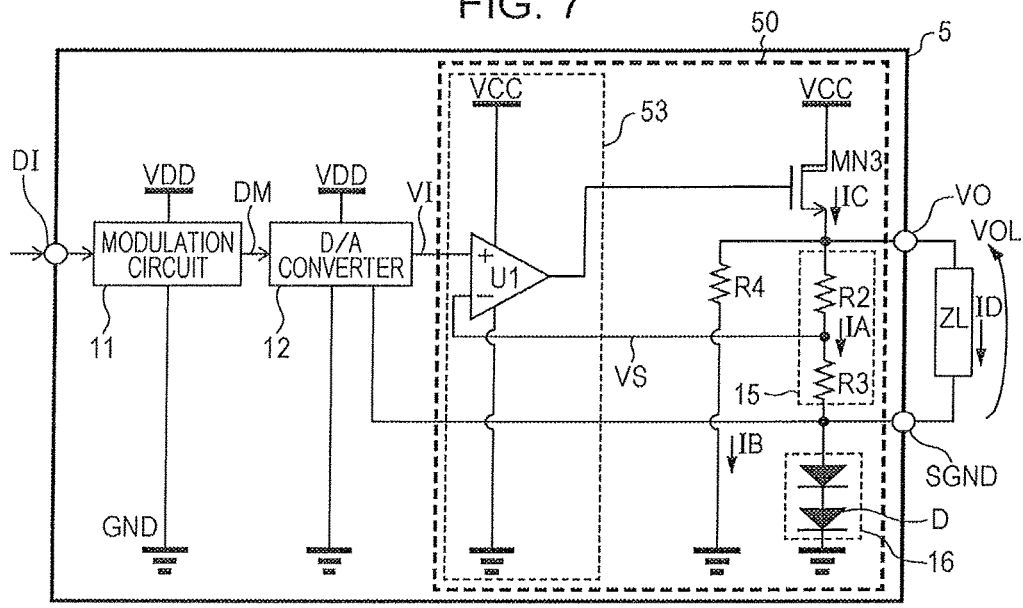
FIG. 7 is a diagram illustrating a voltage generating device including an output circuit according to a fifth embodiment.

FIG. 7 is a diagram illustrating a voltage generating device including an output circuit according to a fifth embodiment.

The voltage generating device 5 illustrated in FIG. 7 is different from the voltage generating device 1 in that a source follower circuit is provided in the output stage of the output circuit 50. Except for the output circuit 50, the configuration thereof is the same as that of the voltage generating device 1. In the following description, the same elements as those of the voltage generating device 1 according to the first embodiment are denoted by the same reference numerals, and the detailed description thereof is omitted.

Specifically, the output circuit 50 is formed of a negative feedback amplification circuit 53, an output transistor MN3, the output load 15, the constant voltage source 16, and the resistor R4.

The output transistor MN3 and the output load 15 form a source follower circuit. Specifically, the output transistor MN3 is connected between the power supply node VCC and the output terminal VO. The output transistor MN3 is, for example, a power transistor having a current output ability for driving the load ZL, and is, for example, an N-channel MOS transistor. A source electrode of the output transistor MN3 is connected to the output terminal VO, and a drain electrode of the output transistor MN3 is connected to the power supply node VCC. The output load 15 is connected between the output terminal VO and the output terminal SGND. The output load 15 is formed of, for example, the resistors R2 and R3 connected in series between the output terminal VO and the output terminal SGND. A voltage generated by dividing a voltage by the resistors R2 and R3 is input as the monitor voltage VS to the negative feedback amplification circuit 53.

In this embodiment, the source electrode of the output transistor MN3 corresponds to the first main electrode of the output transistor according to the present invention, the drain electrode of the output transistor MN3 corresponds to the second main electrode of the output transistor according to the present invention, and a gate electrode of the output transistor MN3 corresponds to the control electrode of the output transistor according to the present invention.

The negative feedback amplification circuit 53 controls the output transistor MN3 so that the monitor voltage VS matches the input voltage VI. The negative feedback amplification circuit 53 includes, for example, the differential amplification circuit U1 that is operated by being supplied with power from the power supply node VCC. The input voltage VI is supplied to the noninverting input terminal (+) of the differential amplification circuit U1, and the monitor voltage VS is supplied to the inverting input terminal (−) of the differential amplification circuit U1. The output voltage of the differential amplification circuit U1 is supplied to the gate electrode of the output transistor MN3.

Accordingly, as in the output circuit 10 according to the first embodiment, the voltage VOL proportional to the input voltage VI is output from between the output terminal SGND and the output terminal VO, and the voltage VOL is supplied to the load ZL.

In the output circuit 50 according to the fifth embodiment, as in the output circuit 10 according to the first embodiment, the stability of the negative feedback loop in the output circuit 50 can be enhanced, and the linearity of an output voltage with respect to an input voltage can be enhanced. Furthermore, since the output circuit 50 includes two amplification stages (the differential amplification circuit U1 and the source follower circuit formed of the output transistor MN3 and the output load 15), the circuit scale can be reduced. Also, further enhancement of the stability of the output circuit 50 can be expected compared to the case where there are three amplification stages.

The invention made by the inventors has been described in detail on the basis of the embodiments. The present invention is not limited thereto and can be variously changed without deviating from the gist thereof.

For example, in the first embodiment, a description has been given of an example in which the transistors MP1 and MN1, the resistors R1 to R4, and the constant voltage source 16 that form the output circuit 10 are formed of discrete components. Some or all of these circuit elements may be implemented on one or a plurality of semiconductor chips, and there is no particular limitation. The same applies to the circuit in the subsequent stage of the differential amplification circuit U1 according to the second to fifth embodiments.

In the foregoing embodiments, a description has been given of an example in which the smoothing circuit 122 in the D/A converter 12 includes two stages of low-pass filter circuits (Rf1 and Cf1, Rf2 and Cf2) and a voltage follower circuit formed of the differential amplification circuit U2. The circuit configuration of the smoothing circuit 122 is not particularly limited as long as the digital signal DT can be smoothed and converted into an analog signal. For example, an active filter circuit having desired filter characteristics may be used as the smoothing circuit 122.

In the foregoing embodiments, a description has been given of, as an example, the resistor R4 and the constant current source circuit 25 serving as a circuit that forms a current path between the output terminal VO and the ground node GND. The circuit configuration of the circuit that forms the current path is not particularly limited as long as the circuit is capable of causing a sufficient current to flow through the transistor MP1 when the output voltage VOL is 0 V or around 0 V.

In the foregoing embodiments, a description has been given of an example in which diodes are used as the constant voltage sources 16 and 26. The circuit configuration of the constant voltage sources 16 and 26 is not particularly limited as long as it is able to generate a constant voltage.

In the foregoing embodiments, a description has been given of an example in which the transistors MP1, MN2, and MN3 in the output stage are MOS transistors. The present invention is not limited thereto and various transistors may be used. For example, a bipolar transistor may be used instead of a MOS transistor. In a case where a bipolar transistor is applied, for example, the emitter electrode corresponds to the first main electrodes of the output transistor and amplification transistor according to the present invention, the collector electrode corresponds to the second main electrodes of the output transistor and amplification transistor according to the present invention, and the base electrode corresponds to the control electrodes of the output transistor and amplification transistor according to the present invention.

Also, in the foregoing embodiments, the output load 15 is a circuit formed of the resistors R2 and R3 connected in series, but the present invention is not limited thereto. For example, the output load 15 may be formed of one resistance element (the resistor R3 is deleted and short-circuited) and thereby the voltage at the output terminal VO may be input as the monitor voltage VS to the differential amplification circuit U1.

INDUSTRIAL APPLICABILITY

The output circuit and voltage generating device according to the present invention are applicable to various applications, for example, to a control system that controls an operation valve or the like on the basis of a detection signal received from various types of sensors in a flowmeter, air-conditioning equipment, or the like.

REFERENCE SIGNS LIST

1 to 5: voltage generating device
D1: digital input terminal
VO, SGND: output terminal
ZL: load
11: modulation circuit
12: D/A converter
10, 20, 30, 40, 50: output circuit
DM: modulated digital signal
VI: input voltage
VOL: output voltage
VS: monitor voltage
13, 33, 43, 53: negative feedback amplification circuit
MP1, MP2: P-channel transistor
15: output load
16, 26: constant voltage source
25: constant current source circuit
R4: resistor
MN1, MN2, MN3: N-channel transistor
D: diode
U1, U2: differential amplification circuit

The invention claimed is:

1. An output circuit comprising:
a first output terminal and a second output terminal;
an output transistor connected between a first fixed-potential node to which a direct current voltage is supplied and the first output terminal;
an output load connected between the first output terminal and the second output terminal;
a control circuit that controls the output transistor so that a monitor voltage based on a voltage between the first output terminal and the second output terminal matches an input voltage supplied from an outside;
a constant voltage source that generates a constant voltage, one end of the constant voltage source being connected to the second output terminal, the other end of the constant voltage source being connected to a second fixed-potential node to which a direct current voltage different from the direct current voltage supplied to the first fixed-potential node is supplied; and
a circuit that forms a current path between the first output terminal and the second fixed-potential node, the second fixed-potential node being different from the second output terminal.

2. The output circuit according to claim 1, wherein the circuit that forms the current path includes a resistance element connected between the first output terminal and the second fixed-potential node.

3. The output circuit according to claim 1, wherein the circuit that forms the current path includes a constant current source circuit connected between the first output terminal and the second fixed-potential node.

4. The output circuit according to claim 1, wherein the direct current voltage supplied to the first fixed-potential node is a power supply voltage, and the direct current voltage supplied to the second fixed-potential node is a ground voltage.

5. The output circuit according to claim 1, wherein the direct current voltage supplied to the first fixed-potential node is a ground voltage, and the direct current voltage supplied to the second fixed-potential node is a power supply voltage.

6. The output circuit according to claim 1, wherein the output load includes a first resistance element and a second resistance element connected in series between the first output terminal and the second output terminal, the control circuit includes
a differential amplification circuit including an inverting input terminal and a noninverting input terminal, a voltage at a connection node between the first resistance element and the second resistance element being input as a monitor voltage to the inverting input terminal, the input voltage being input to the noninverting input terminal,
an amplification transistor, and
a load element whose one end is connected to the first fixed-potential node,
a first main electrode of the amplification transistor is connected to the second fixed-potential node, a second main electrode of the amplification transistor is connected to the other end of the load element, and a control electrode of the amplification transistor is connected to an output terminal of the differential amplification circuit, and
a first main electrode of the output transistor is connected to the first fixed-potential node, a second main electrode of the output transistor is connected to the first output terminal, and a control electrode of the output transistor is connected to the second main electrode of the amplification transistor.

7. The output circuit according to claim 1, wherein the control circuit includes a differential amplification circuit including an inverting input terminal and a noninverting input terminal, the input voltage being input to the inverting input terminal, the monitor voltage being input to the noninverting input terminal, and
a first main electrode of the output transistor is connected to the first fixed-potential node, a second main electrode of the output transistor is connected to the first output terminal, and a control electrode of the output transistor is connected to an output terminal of the differential amplification circuit.

8. The output circuit according to claim 1, wherein the control circuit includes a differential amplification circuit including a noninverting input terminal and an inverting input terminal, the input voltage being input to the noninverting input terminal, the monitor voltage being input to the inverting input terminal, and
a first main electrode of the output transistor is connected to the first output terminal, a second main electrode of the output transistor is connected to the first fixed-potential node, and a control electrode of the output transistor is connected to an output terminal of the differential amplification circuit.

9. A voltage generating device comprising:
a modulation circuit that modulates a digital signal;
a D/A converter that converts the digital signal modulated by the modulation circuit into an analog signal; and
the output circuit according to claim 1 to which the analog signal obtained through conversion performed by the D/A converter is input as the input voltage, wherein
the D/A converter includes
   a conversion circuit that converts the modulated digital signal into a digital signal with an amplitude that is based on a voltage at the second output terminal, and
   a smoothing circuit that smooths the digital signal obtained through conversion performed by the conversion circuit and that outputs a resulting signal as the analog signal.

\* \* \* \* \*